US012749650B2

(12) United States Patent
Yamazawa

(10) Patent No.: US 12,749,650 B2
(45) Date of Patent: Sep. 29, 2026

(54) PLASMA PROCESSING APPARATUS

(71) Applicant: Tokyo Electron Limited, Tokyo (JP)

(72) Inventor: Yohei Yamazawa, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 805 days.

(21) Appl. No.: 18/110,470

(22) Filed: Feb. 16, 2023

(65) Prior Publication Data

US 2023/0260752 A1 Aug. 17, 2023

(30) Foreign Application Priority Data

Feb. 16, 2022 (JP) ................................ 2022-021813

(51) Int. Cl.
*H01J 37/32* (2006.01)
*H01Q 1/26* (2006.01)

(52) U.S. Cl.
CPC ..... *H01J 37/3211* (2013.01); *H01J 37/32119* (2013.01)

(58) Field of Classification Search
None
See application file for complete search history.

(56) References Cited

U.S. PATENT DOCUMENTS 5,907,221 A 5/1999 Sato et al.
8,551,289 B2 * 10/2013 Nishimura ........... H01J 37/3211 156/345.48
9,987,332 B2 * 6/2018 Hess ....................... A61P 25/00
2003/0019582 A1 * 1/2003 Drewery ........... H01J 37/32642 156/345.43
2003/0079838 A1 * 5/2003 Brcka ................. C23C 14/3471 438/731
2011/0094997 A1 * 4/2011 Yamazawa ........ H01L 21/67069 216/68
2012/0073757 A1 * 3/2012 Yamazawa ........... H01J 37/3211 156/345.48
2012/0074100 A1 * 3/2012 Yamazawa ........ H01J 37/32174 216/68

(Continued)

FOREIGN PATENT DOCUMENTS

JP 2010-135298 A 6/2010
JP 5227245 B2 7/2013

*Primary Examiner* — Sylvia Macarthur
(74) *Attorney, Agent, or Firm* — XSENSUS LLP

(57) ABSTRACT

A plasma processing apparatus is provided. The apparatus comprises: a chamber accommodating a substrate; a window member forming an upper portion of the chamber; a gas inlet port disposed in at least one of a sidewall of the chamber and the window member, and configured to supply a gas into the chamber; and an antenna disposed above the chamber with the window member interposed therebetween, having a linear shape and made of a conductive material, and configured to produce plasma from the gas supplied into the chamber by radiating a radio frequency (RF) power into the chamber. The antenna includes: a first coil to which the RF power is supplied; and a plurality of second coils formed in the same shape and arranged around the first coil to be rotationally symmetrical with respect to a central axis of the first coil. One ends of the second coils are connected one-to-one to variable capacitors.

20 Claims, 8 Drawing Sheets

(56) References Cited

U.S. PATENT DOCUMENTS

| | | | | |
|---|---|---|---|---|
| 2012/0223060 | A1* | 9/2012 | Yamazawa | H05H 1/46 219/121.43 |
| 2018/0247858 | A1* | 8/2018 | Nakaya | H01L 21/02205 |
| 2019/0088449 | A1 | 3/2019 | Galstyan et al. | |
| 2023/0260752 | A1* | 8/2023 | Yamazawa | H01J 37/32651 156/345.48 |

* cited by examiner

PLASMA PROCESSING APPARATUS

CROSS-REFERENCE TO RELATED APPLICATION

This application claims priority to Japanese Patent Application No. 2022-021813 filed on Feb. 16, 2022, the entire contents of which are incorporated herein by reference.

TECHNICAL FIELD

Various aspects and embodiments of the present disclosure relate to a plasma processing apparatus.

BACKGROUND

In plasma processing, the uniformity of processing is an important factor in improving yield. The uniformity of processing is becoming more and more important with the recent progress in miniaturization of semiconductor devices and the increase in the diameter of semiconductor substrates. Patent Document 1 discloses a technique of controlling distribution of plasma in a chamber by providing a plurality of coils of an antenna at positions facing a substrate.

PRIOR ART DOCUMENTS

Patent Document

Patent Document 1: Japanese Patent No. 5227245

SUMMARY

The present disclosure provides a plasma processing apparatus capable of improving uniformity of plasma processing.

One aspect of the present disclosure comprises: a chamber accommodating a substrate; a window member forming an upper portion of the chamber; a gas inlet port disposed in at least one of a sidewall of the chamber and the window member, and configured to supply a gas into the chamber; and an antenna disposed above the chamber with the window member interposed therebetween, having a linear shape and made of a conductive material, and configured to produce plasma from the gas supplied into the chamber by radiating a radio frequency (RF) power into the chamber, wherein the antenna includes: a first coil to which the RF power is supplied; and a plurality of second coils formed in the same shape and arranged around the first coil to be rotationally symmetrical with respect to a central axis of the first coil, wherein one ends of the second coils are connected one-to-one to variable capacitors.

BRIEF DESCRIPTION OF THE DRAWINGS

The objects and features of the present disclosure will become apparent from the following description of embodiments, given in conjunction with the accompanying drawings, in which.

DETAILED DESCRIPTION

Hereinafter, embodiments of a plasma processing apparatus of the present disclosure will be described in detail with reference to the accompanying drawings. The following embodiments are not intended to limit the plasma processing apparatus of the present disclosure.

The present disclosure provides a technique capable of further improving the uniformity of plasma processing.

First Embodiment

[Configuration of Plasma Processing System 100]

Figure 1:
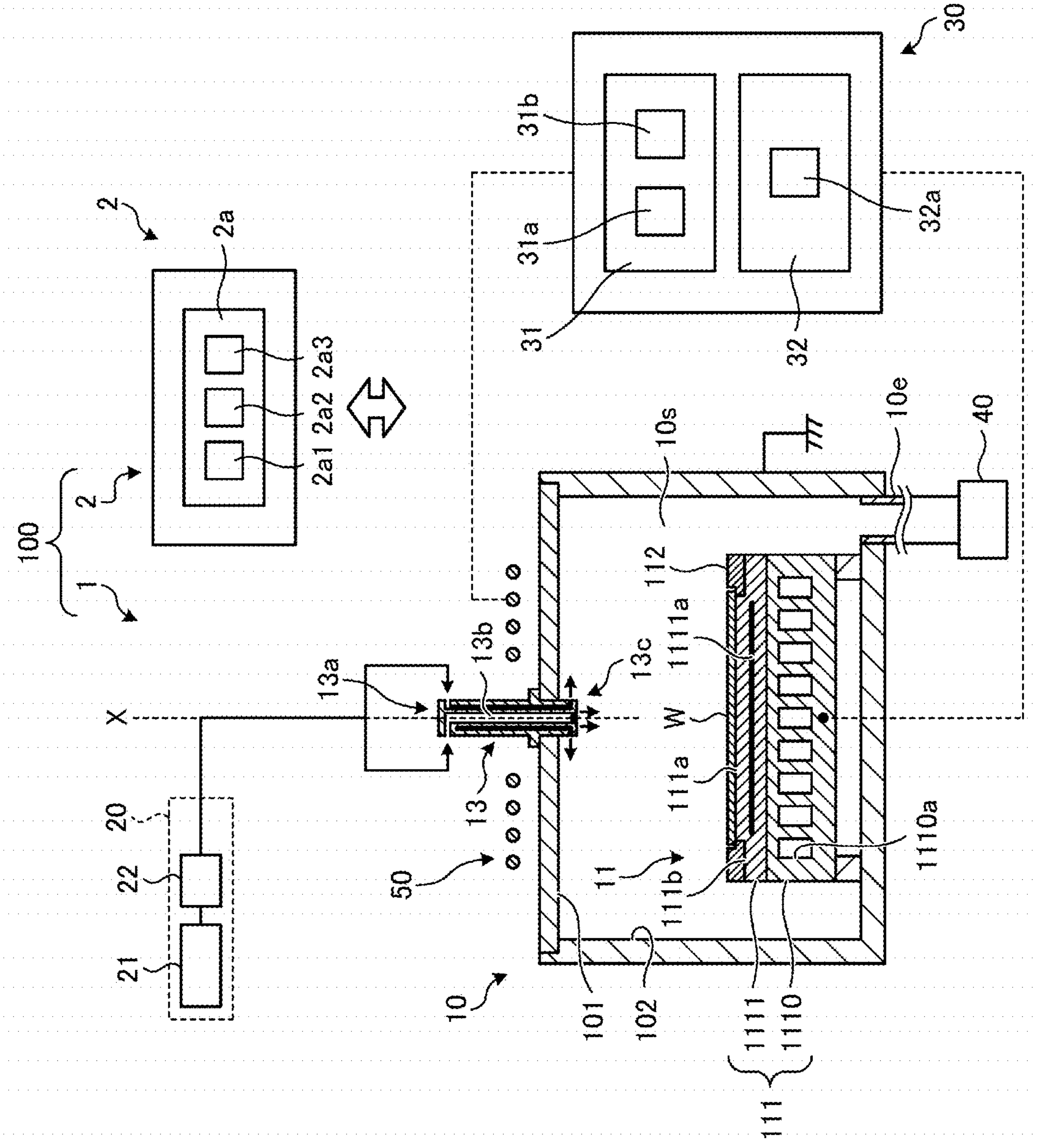
FIG. 1 is a schematic cross-sectional view showing an example of a plasma processing system according to an embodiment of the present disclosure.

Hereinafter, a configuration example of a plasma processing system 100 will be described. FIG. 1 is a schematic cross-sectional view showing an example of the plasma processing system 100 according to one embodiment of the present disclosure. The plasma processing system 100 includes an inductively coupled plasma processing apparatus 1 and a controller 2. The plasma processing apparatus 1 includes a plasma processing chamber 10, a gas supply part 20, a power supply 30, and an exhaust system 40. The plasma processing chamber 10 further includes a window member 101 forming an upper portion of the plasma processing chamber 10. In the present embodiment, the window member 101 is made of a dielectric such as quartz or ceramic. The window member 101 may be made of a metal (conductor) such as aluminum, or a semiconductor such as silicon. The plasma processing apparatus 1 further includes a substrate support 11, a gas introducing member, and an antenna 50. The substrate support 11 is disposed in the plasma processing chamber 10. The antenna 50 is disposed above the plasma processing chamber 10 with the window member 101 interposed therebetween, and is formed in a linear shape and made of a conductive material such as copper. The antenna 50 is disposed to be rotationally symmetrical with respect to a central axis X. The term "rotational symmetry" is a type of symmetry that characterizes a figure, and indicates a feature in which a figure overlaps itself when it is rotated by (360/n)° around a certain center (n being an integer of 2 or more). The antenna 50 radiates an RF power into the plasma processing chamber 10 to produce plasma from a gas supplied into the plasma processing chamber 10. The plasma processing chamber 10 has a plasma processing space 10*s* defined by the window member 101, a side wall 102 of the plasma processing chamber 10, and the substrate support 11. The plasma processing chamber 10 has at least one gas supply port for supplying at least one processing gas into the plasma processing space 10*s* and at least one gas exhaust port for exhausting a gas from the plasma processing space.

The substrate support 11 includes a main body 111 and a ring assembly 112. The main body 111 has a substrate supporting surface 111*a* that is a central area for supporting the substrate W and a ring supporting surface 111*b* that is an annular area for supporting the ring assembly 112. The substrate W may also be referred to as "wafer." The ring supporting surface 111*b* of the main body 111 surrounds the substrate supporting surface 111*a* of the main body 111 in plan view. The substrate W is placed on the substrate supporting surface 111*a* of the main body 111, and the ring assembly 112 is placed on the ring supporting surface 111*b* of the main body 111 to surround the substrate W on the substrate supporting surface 111*a* of the main body 111.

In one embodiment, the main body 111 includes a base 1110 and an electrostatic chuck 1111. The base includes an electrically conductive member. The conductive member of the base 1110 functions as a lower electrode. The electrostatic chuck 1111 is disposed on the base 1110. The upper surface of the electrostatic chuck 1111 serves as the substrate supporting surface 111*a*. The ring assembly 112 includes one or more annular members. At least one of the annular members is an edge ring. Although not shown, the substrate support 11 may include a temperature control module configured to control at least one of the electrostatic chuck 1111, the ring assembly 112, and the substrate W to a target temperature. The temperature regulation module may include a heater 1111*a*, a heat transfer medium, a channel 1110*a*, or a combination thereof. A heat transfer fluid, such as brine or a gas, flows through the channel 1110*a*. Further, the substrate support 11 may include a heat transfer gas supply part configured to supply a heat transfer gas to the gap between the backside of the substrate W and the substrate supporting surface 111*a*.

The gas introducing member is configured to introduce at least one processing gas from the gas supply part 20 into the plasma processing space 10*s*. In one embodiment, the gas introducing member includes a central gas injector (CGI) 13. The central gas injector 13 is disposed above the substrate support 11, and is attached to a central opening formed in the window member 101. The central gas injector 13 has at least one gas supply port 13*a*, at least one gas channel 13*b*, and at least one gas inlet port 13*c*. The processing gas supplied to the gas supply port 13*a* passes through the gas channel 13*b* and is introduced into the plasma processing space 10*s* from the gas inlet port 13*c*. The gas introducing member may include, in addition to or instead of the central gas injector 13, one or multiple side gas injectors (SGI) attached to one or multiple openings formed in the sidewall 102. The side gas injector is an example of a gas inlet port.

The gas supply part 20 may include at least one gas source 21 and at least one flow rate controller 22. In one embodiment, the gas supply part 20 is configured to supply at least one processing gas from the corresponding gas source 21 through the corresponding flow rate controller 22 to the central gas injector 13. The flow rate controllers 22 may include, e.g., a mass flow controller or a pressure-controlled flow rate controller. The gas supply part 20 may include one or more flow rate modulation devices for modulating the flow rate of at least one processing gas or causing it to pulsate.

The power supply 30 includes an radio frequency (RF) power supply 31 coupled to the plasma processing chamber 10 through at least one impedance matching circuit. The RF power supply 31 is configured to supply at least one RF signal such as a source RF power and a bias RF signal to only the antenna 50, or to both the antenna 50 and the conductive member of the substrate support 11. The RF signal may also be referred to as "RF power." Accordingly, plasma is produced from at least one processing gas supplied to the plasma processing space 10*s*. Therefore, the RF power supply 31 may function as at least a part of a plasma generator configured to generate plasma from one or more processing gases in the plasma processing chamber 10. Further, by supplying the bias RF signal to the conductive member of the substrate support 11, a bias potential is generated at the substrate W, and ions in the produced plasma can be attracted to the substrate W.

In one embodiment, the RF power supply 31 includes a first RF generator 31*a* and a second RF generator 31*b*. The first RF generator 31*a* is coupled to the antenna 50 through at least one impedance matching circuit, and is configured to generate a source RF signal for plasma generation. The source RF signal may also be referred to as "source RF power." In one embodiment, the source RF signal has a frequency within a range of 13 MHz to 150 MHz. In one embodiment, the first RF generator 31*a* may be configured to generate a plurality of source RF signals having different frequencies. The generated one or multiple source RF signals are supplied to the antenna 50. The second RF generator 31*b* is coupled to the conductive member of the substrate support 11 through at least one impedance matching circuit, and is configured to generate a bias RF signal. The bias RF signal may also be referred to as "bias RF power." In one embodiment, the bias RF signal has a frequency lower than the frequency of the source RF signal. In one embodiment, the bias RF signal has a frequency within a range of 400 kHz to 13.56 MHz. In one embodiment, the second RF generator 31*b* may be configured to generate multiple bias RF signals having different frequencies. The generated one or multiple bias RF signals are supplied to the conductive member of the substrate support 11. In various embodiments, at least one of the source RF signal and the bias RF signal may pulsate.

The power supply 30 may include a DC power supply 32 coupled to the plasma processing chamber 10. The DC power supply 32 includes a DC generator 32*a*. In one embodiment, the DC generator 32*a* is connected to the conductive member of the substrate support 11, and is configured to generate a bias DC signal. The generated bias DC signal is applied to the conductive member of the substrate support 11. In one embodiment, the bias DC signal may be applied to another electrode such as an electrode in the electrostatic chuck 1111. In various embodiments, the bias DC signal may pulsate. The bias DC generator 32*a* may be provided in addition to the RF power supply 31, or may be provided instead of the second RF generator 31*b*.

The exhaust system 40 may be connected to a gas exhaust port 10*e* disposed at the bottom portion of the plasma processing chamber 10, for example. The exhaust system 40 may include a pressure control valve and a vacuum pump. The pressure control valve adjusts a pressure in the plasma processing space 10*s*. The vacuum pump may include a turbo molecular pump, a dry pump, or a combination thereof.

The controller 2 processes computer-executable instructions that cause plasma processing apparatus 1 to perform various steps described in the present disclosure. The controller 2 may be configured to control individual components of the plasma processing apparatus 1 to perform various steps described herein. In one embodiment, the controller 2 may be entirely or partially included in the plasma processing apparatus 1. The controller 2 may include a computer 2*a*, for example. The computer 2*a* may include a central processing unit (CPU) 2*a*1, a storage device 2*a*2, and a communication interface 2*a*3, for example. The central processing unit 2*a*1 may be configured to perform various control operations based on programs stored in the storage device 2*a*2. The storage device 2*a*2 may include a random access memory (RAM), a read only memory (ROM), a hard disk drive (HDD), a solid state drive (SSD), or a combination thereof. The communication interface 2a3 may communicate with the plasma processing apparatus 1 via a communication line such as a local area network (LAN).

[Configuration of Antenna 50]

Figure 2:
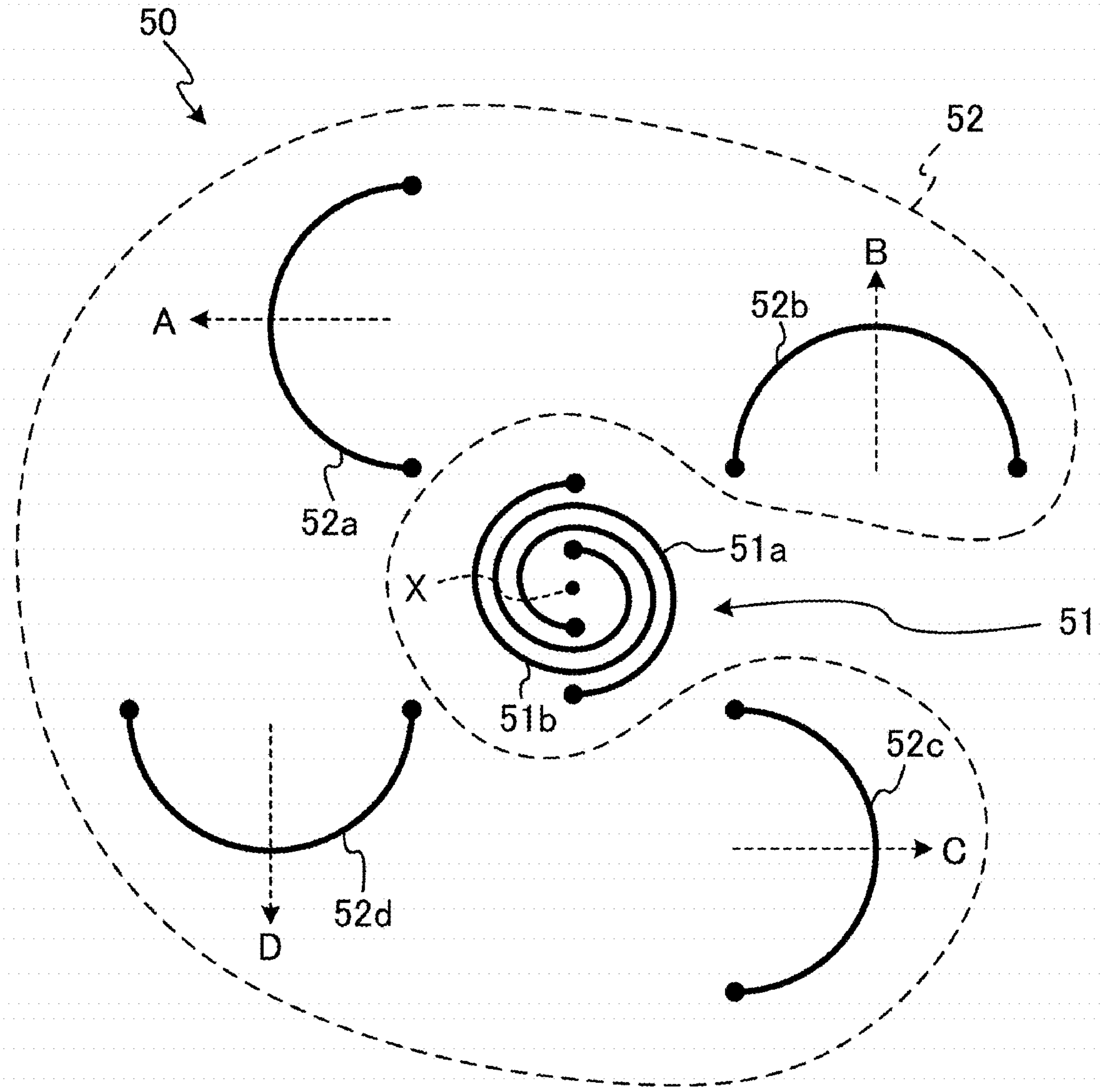
FIG. 2 is a plan view showing an example of the shape and arrangement of an antenna.

FIG. 2 is a plan view showing an example of the shape and arrangement of the antenna 50. The antenna 50 has an inner coil 51 and an outer coil 52. The inner coil 51 is an example of a first coil. In the present embodiment, the inner coil 51 and the outer coil 52 are arranged on the same plane (for example, horizontal plane) that intersects the central axis X. However, the present disclosure is not limited thereto, and the inner coil 51 and the outer coil 52 may be arranged on different planes with each other. Alternatively, at least one part of the inner coil 51 and the outer coil 52 may be arranged on different plane than the plane on which the other part of the inner coil 51 and the outer coil 52 are arranged.

The RF power is supplied from the power supply 30 to the inner coil 51. The inner coil 51 generates a magnetic field by the RF power supplied from the power supply 30, and is inductively coupled with the outer coil 52 by the generated magnetic field. The inner coil 51 radiates a part of the RF power supplied from the power supply 30 into the plasma processing chamber 10 and supplies another part of the RF power to the outer coil 52. In the present embodiment, the inner coil 51 has coils **51*a* and 51*b* spaced apart from each other. The coils 51*a* and 51*b* are arranged to be rotationally symmetrical with respect to the central axis X. In other words, the inner coil 51** has a rotationally symmetrical shape with respect to the central axis X.

In the example of FIG. 2, the coils **51*a* and 51*b* are formed in a spiral shape centering on the central axis X and making 1.5 turns around the central axis X. In the example of FIG. 2, the outermost end of the coil 51*a* is disposed at a position opposite to the outermost end of the coil 51*b* with respect to the central axis X, and the innermost end of the coil 51*a* is disposed at a position opposite to the innermost end of the coil 51*b* with respect to the central axis X. Accordingly, the influence of discontinuous electromagnetic waves radiated from the ends of the coils 51*a* and 51*b* on the plasma produced in the plasma processing space 10*s*** can be reduced.

In the example of FIG. 2, the inner coil 51 has two coils **51*a* and 51*b* formed in a spiral shape, but the present disclosure is not limited thereto. The coils forming the inner coil 51** may have a linear shape, a bent shape, a curved shape, a radial shape, a polygonal shape, or a combination thereof, as long as they are rotationally symmetrical with respect to the central axis X.

The outer coil 52 has a plurality of coils **52*a*, 52*b*, 52*c*, and 52*d* formed in the same shape. The coils 52*a* to 52*d* are examples of a second coil. The coils 52*a* to 52*d* are arranged around the inner coil 51 to be rotationally symmetrical with respect to the central axis X. Each of the coils 52*a* to 52*d* is inductively coupled with the inner coil 51 and radiates an RF power to the plasma processing space 10*s* in response to the RF power supplied from the inner coil 51. In the example of FIG. 2, four coils 52*a* to 52*d* are arranged to be rotationally symmetrical around the inner coil 51, but the present disclosure is not limited thereto. As long as multiple coils are arranged to be rotationally symmetrical around the inner coil 51, the number of coils forming the outer coil 52** may be less than four or may be more than four. Further, the number of coils may be even or odd.

Further, in the present embodiment, the coils **52*a* to 52*d* are curved and arranged around the inner coil 51 to be convex toward a direction moving away from the inner coil 51 (i.e., concave when viewed from the inner coil 51). In the example of FIG. 2, the coil 52*a* is disposed around the inner coil 51 to be convex toward a direction A moving away from the inner coil 51, and the coil 52*b* is disposed around the inner coil 51 to be convex in a direction B moving away from the inner coil 51. Similarly, the coil 52*c* is disposed around the inner coil 51 to be convex in a direction C moving away from the inner coil 51, and the coil 52*d* is disposed around the inner coil 51 to be convex in a direction D moving away from the inner coil 51**.

In the example of FIG. 2, the coils **52*a* to 52*d* of the outer coil 52 have a curved shape, but the present disclosure is not limited thereto. The coils 52*a* to 52*d* of the outer coil 52** may have a linear shape, a bent shape, a curved shape, a radial shape, a polygonal shape, or a combination thereof. Examples of the curved shape are Archimedean spiral, parabolic spiral, and logarithmic spiral.

Figure 3:
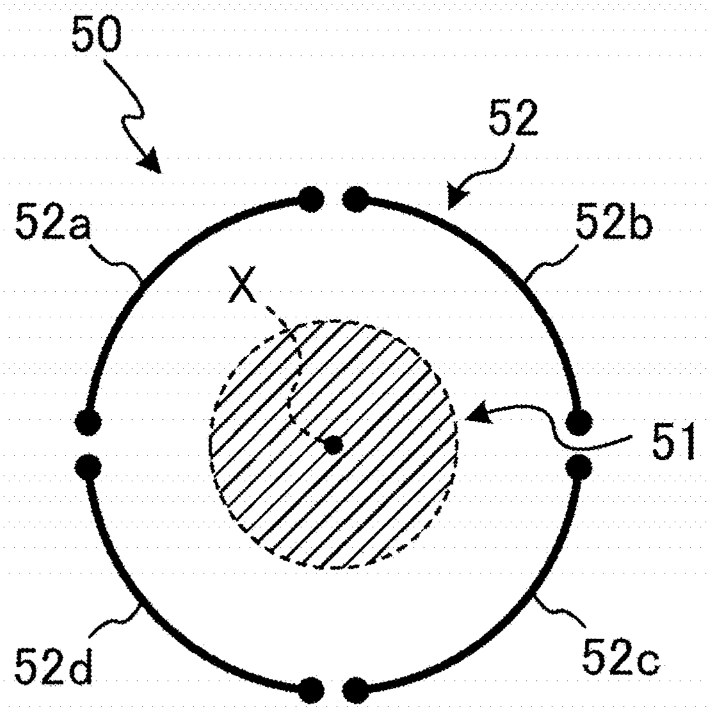
FIGS. 3 to 6 are plan views showing examples of the shape and arrangement of second coils.
Figure 4:
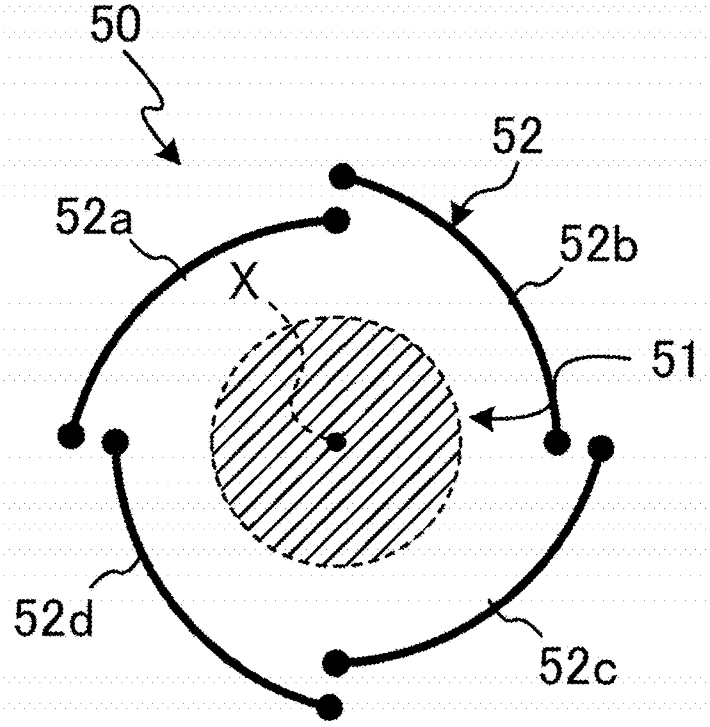
Figure 5:
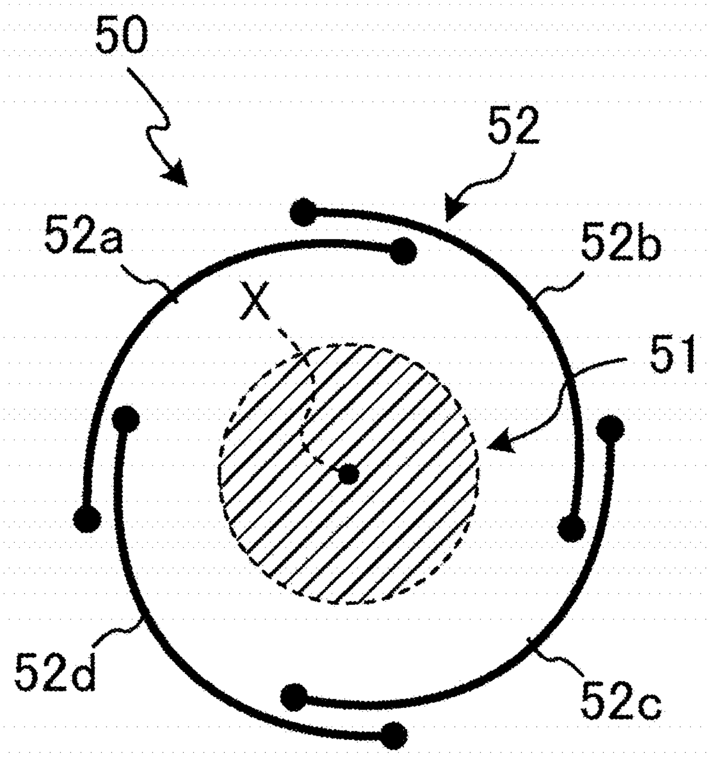

For example, the coils **52*a* to 52*d* of the outer coil 52 may be arranged around the inner coil 51 along the circumference about the central axis X as shown in FIG. 3, for example. Accordingly, the coils 52*a* to 52*d* may be arranged such that the ends of adjacent coils overlap in the circumferential direction about the central axis X as shown in FIG. 4, for example. Further, the coils 52*a* to 52*d* may be arranged such that adjacent coils partially overlap as shown in FIG. 5**, for example.

Figure 6:
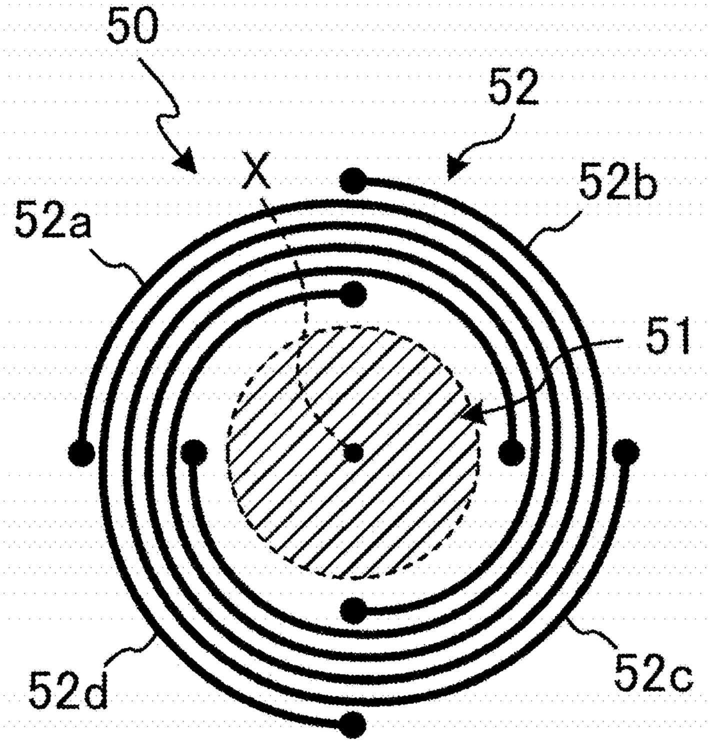

Alternatively, as shown in FIG. 6, for example, each of the coils **52*a* to 52*d* may be formed in a spiral shape centering on the central axis X and making 1.25 turns around the central axis X. In the example of FIG. 6, the coils 52*a* to 52*d* are arranged to be shifted by 90° with respect to the central axis X. Accordingly, the influence of discontinuous electromagnetic waves radiated from the ends of the coils 52*a* to 52*d* on the plasma produced in the plasma processing space 10*s*** can be reduced.

In FIGS. 3 to 6, the area where the inner coil 51 is disposed is indicated by hatching. Although FIGS. 3 to 6 illustrate variation in the shape of the outer coil 52, the variation in the shape of the antenna illustrated in FIGS. 3 to 6 may also be applied to the inner coil 51.

[Circuit Configuration of Antenna 50]

Figure 7:
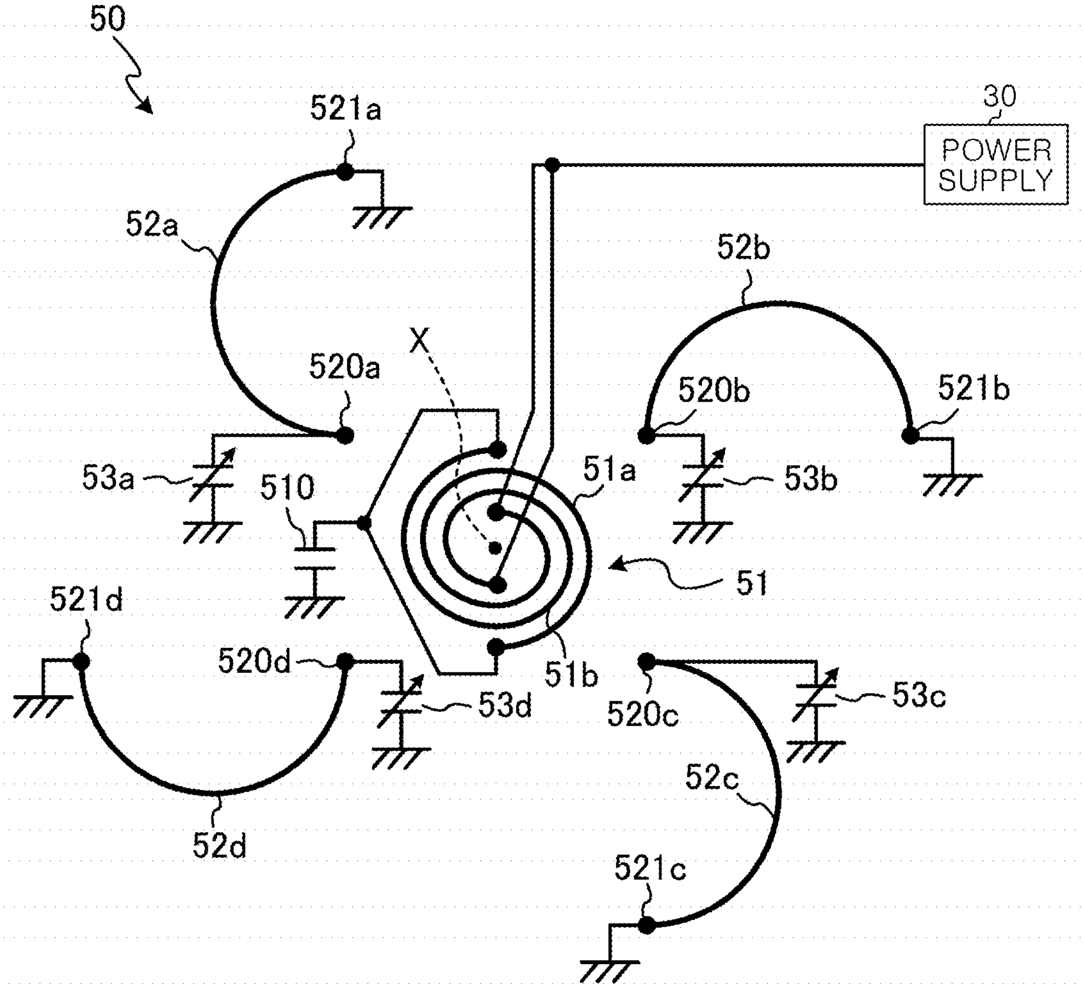
FIG. 7 is a connection diagram showing an example of a circuit configuration of an antenna in a first embodiment.

FIG. 7 is a connection diagram showing an example of a circuit configuration of the antenna 50 in a first embodiment. One ends of the coils **51*a* and 51*b* of the inner coil 51 are connected to the power supply 30, and the other ends of the coils 51*a* and 51*b* are grounded through a capacitor 510**.

Each of the coils **52*a* to 52*d* of the outer coil 52 is connected to one variable capacitor. In the example of FIG. 7, an end portion 520*a* that is one end of the coil 52*a* is grounded through a variable capacitor 53*a*. An end portion 521*a* that is the other end of the coil 52*a* is grounded. An end portion 520*b* that is one end of the coil 52*b* is grounded through a variable capacitor 53*b*. An end portion 521*b* that is the other end of the coil 52*b* is grounded. An end portion 520*c* that is one end of the coil 52*c* is grounded through a variable capacitor 53*c*. An end portion 521*c* that is the other end of the coil 52*c* is grounded. An end portion 520*d* that is one end of the coil 52*d* is grounded through a variable capacitor 53*d*. An end portion 521*d* that is the other end of the coil 52*d* is grounded. Each of the end portions 520*a*, 520*b*, 520*c*, and 520*d*** may be grounded through a capacitor with a fixed capacitance.

By adjusting the capacitances of the variable capacitors **53*a* to 53*d*, the currents flowing through the coils 52*a* to 52*d* can be adjusted. The individual adjustment of the capacitances of the variable capacitors 53*a* to 53*d* is performed by the controller 2, for example. By adjusting the currents flowing through the coils 52*a* to 52*d*, the density of plasma produced in the plasma processing space 10***s* below the coils 52*a* to 52*d* can be adjusted. For example, by increasing or decreasing the currents flowing through the coils 52*a* to 52*d* by the same magnitude, the distribution of the plasma density in the radial direction about the central axis X can be adjusted. For example, by adjusting the currents flowing through the coils 52*a* to 52*d* to have different magnitudes, the distribution of the plasma density in the circumferential direction about the central axis X can be adjusted.

The first embodiment has been described above. As can be clearly seen from the above description, the plasma processing apparatus 1 of the present embodiment includes the plasma processing chamber 10, the window member 101, the gas inlet port 13*c*, and the antenna 50. The plasma processing chamber 10 accommodates a substrate W. The window member 101 constitutes the upper portion of the plasma processing chamber 10. The gas inlet port 13*c* is disposed in at least one of the sidewall of plasma processing chamber 10 and the window member 101 to supply a gas into the plasma processing chamber 10. The antenna 50 is disposed above the plasma processing chamber 10 with the window member 101 interposed therebetween, and is formed in a linear shape and made of a conductive material. The antenna 50 radiates an RF power into the plasma processing chamber 10 to produce plasma from the gas supplied into the plasma processing chamber 10. The antenna 50 has the inner coil 51 and the plurality of coils 52*a* to 52*d*. The RF power is supplied to the inner coil 51. The coils 52*a* to 52*d* have the same shape, and are arranged around the inner coil 51 to be rotationally symmetrical with respect to the central axis X of the inner coil 51. One end of each of the coils 52*a* to 52*d* is connected to one variable capacitor. The plasma processing apparatus 1 configured as described above can improve the uniformity of plasma processing.

Further, in the above-described first embodiment, the other ends of the coils 52*a* to 52*d* are grounded. One ends of the variable capacitors 53*a* to 53*d* are connected to the coils 52*a* to 52*d*, respectively, and the other ends thereof are grounded. Accordingly, by adjusting the capacitances of the variable capacitors 53*a* to 53*d*, the currents flowing through the coils 52*a* to 52*d* can be individually adjusted.

Further, in the above-described first embodiment, the inner coil 51 has a rotationally symmetrical shape with respect to the central axis X. Accordingly, the magnetic field can be more uniformly radiated into the plasma processing chamber 10, and the uniformity of the plasma processing can be improved.

Further, in the above-described first embodiment, the inner coil 51 includes the coils 51*a* and 51*b* spaced apart from each other. Accordingly, the magnetic field can be more uniformly radiated into the plasma processing chamber 10, and the uniformity of the plasma processing can be improved.

Further, in the above-described first embodiment, the coils 52*a* to 52*d* are curved and arranged around the inner coil 51 to be convex in the direction moving away from the inner coil 51. Accordingly, the magnitude of the magnetic field radiated to positions below the variable capacitors 53*a* to 53*d* can be individually adjusted with high precision.

Further, in the above-described first embodiment, the inner coil 51 and the coils 52*a* to 52*d* are arranged on the same plane that intersects the central axis X. Accordingly, the distribution of the magnetic field radiated into the plasma processing chamber 10 can be adjusted with high precision.

Second Embodiment

Figure 8:
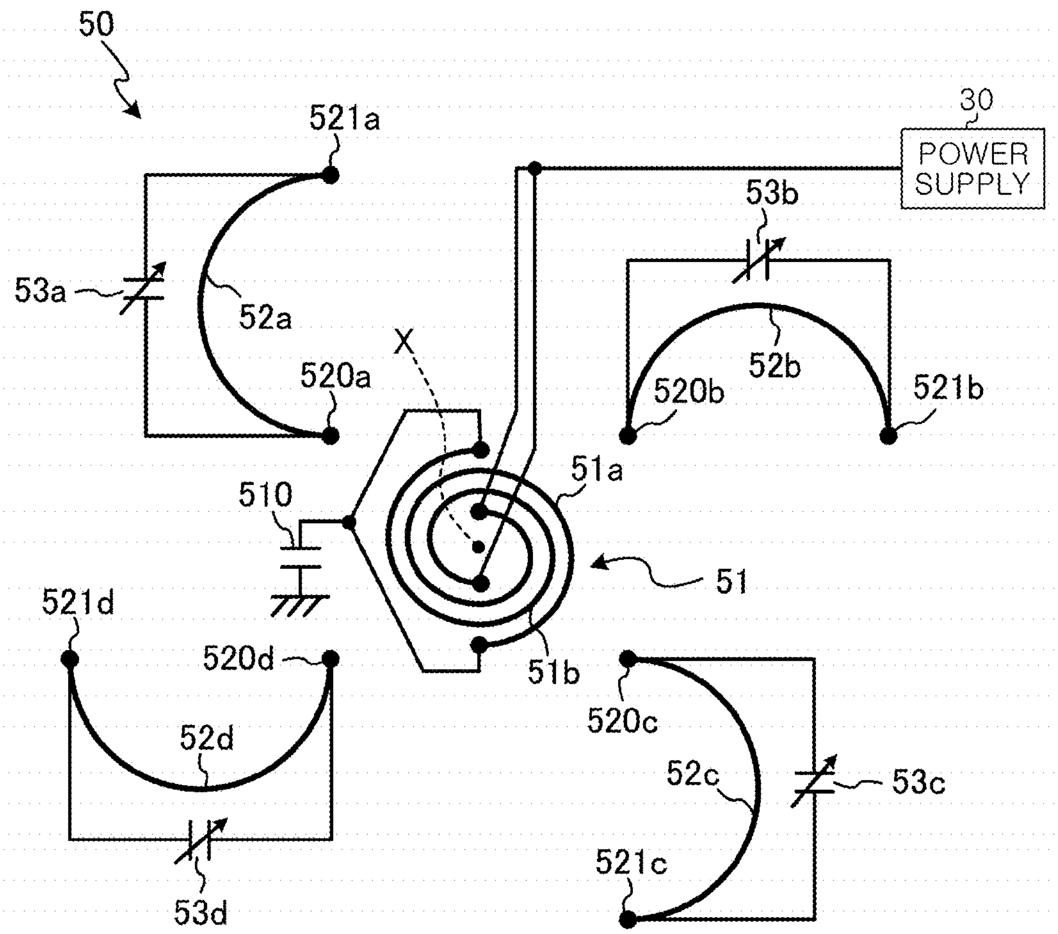
FIG. 8 is a connection diagram showing an example of a circuit configuration of an antenna in a second embodiment.

In the second embodiment, both ends of the coils of the outer coil 52 are connected through variable capacitors. FIG. 8 is a connection diagram showing an example of the circuit configuration of the antenna 50 in the second embodiment. For example, as shown in FIG. 8, the end portions 520*a* and 521*a* of the coil 52*a* are connected through the variable capacitor 53*a*, and the end portions 520*b* and 521*b* of the coil 52*b* are connected through the variable capacitor 53*b*. The end portions 520*c* and 521*c* of the coil 52*c* are connected through the variable capacitor 53*c*, and the end portions 520*d* and 521*d* of the coil 52*d* are connected through the variable capacitor 53*d*. Even in the case of the antenna 50 configured as shown in FIG. 8, the currents flowing through the coils 52*a* to 52*d* can be adjusted by adjusting the capacitances of the variable capacitors 53*a* to 53*d*.

Further, in the antenna 50 configured as shown in FIG. 8, the potential difference between the plasma produced in the plasma processing space 10*s* and each of the coils 52*a* to 52*d* can be reduced. Accordingly, capacitive coupling between the plasma produced in the plasma processing space 10*s* and each of the coils 52*a* to 52*d* can be suppressed.

Third Embodiment

Figure 9:
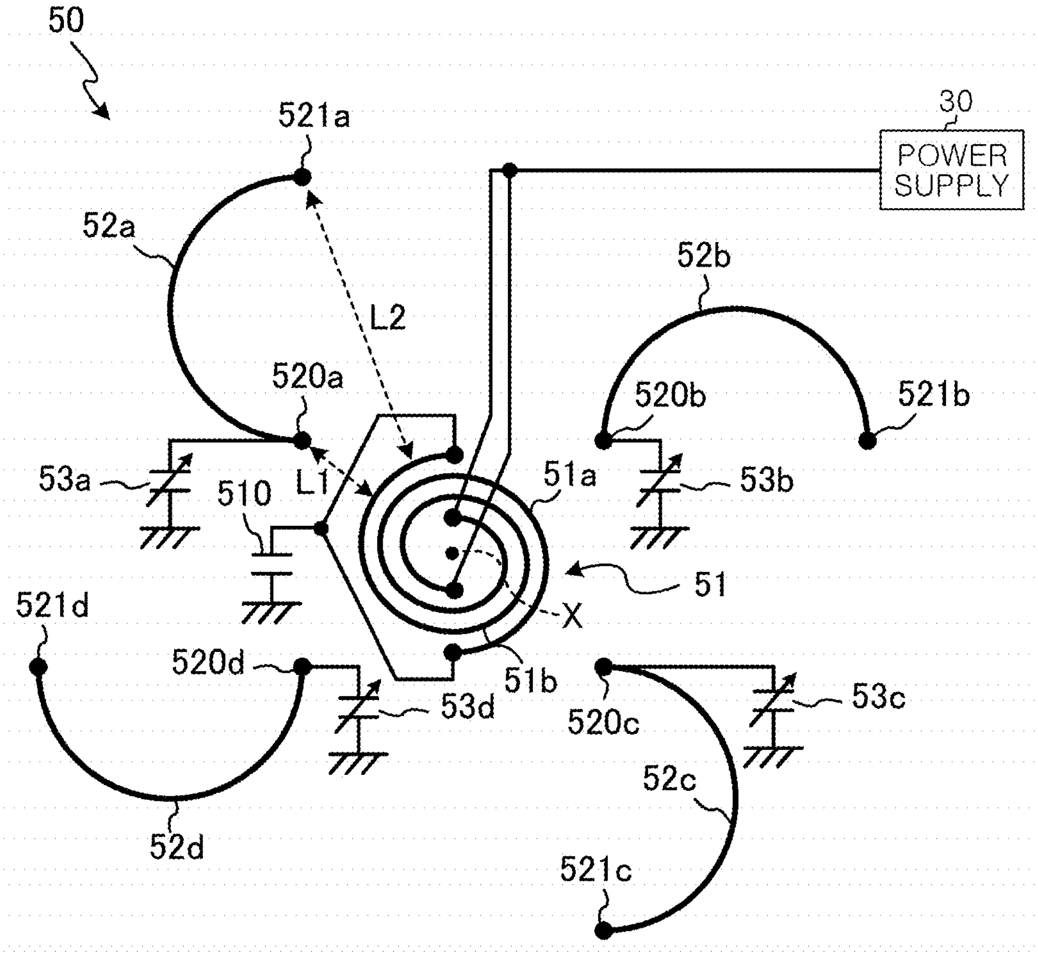
FIG. 9 is a connection diagram showing an example of a circuit configuration of an antenna in a third embodiment.

In the third embodiment, one ends of the coils of the outer coil 52 are grounded through variable capacitors, and the other ends thereof are opened. FIG. 9 is a connection diagram showing an example of the circuit configuration of the antenna 50 according to the third embodiment. For example, as shown in FIG. 9, the end portion 520*a* of the coil 52*a* is grounded through the variable capacitor 53*a*, and the end portion 521*a* thereof is opened. The end portion 520*b* of the coil 52*b* is grounded through the variable capacitor 53*b*, and the end portion 521*b* thereof is opened. The end portion 520*c* of the coil 52*c* is grounded through the variable capacitor 53*c*, and the end portion 521*c* thereof is opened. The end portion 520*d* of the coil 52*d* is grounded through the variable capacitor 53*d*, and the end portion 521*d* thereof is opened. Even in the case of the antenna 50 configured as shown in FIG. 9, the currents flowing through the coils 52*a* to 52*d* can be adjusted by adjusting the capacitances of the variable capacitors 53*a* to 53*d*.

Further, in the antenna 50 configured as shown in FIG. 9, the voltages at the open ends of the coils 52*a* to 52*d* are high. Accordingly, plasma can be ignited even under conditions where it is difficult to ignite plasma, such as in a low-pressure environment. However, when the potential difference between the plasma produced in the plasma processing space 10*s* and the coils 52*a* to 52*d* increases, capacitive coupling occurs between the plasma and the coils 52*a* to 52*d*, and the plasma mode may be switched to a capacitive coupling mode. Therefore, it is preferable that the open ends of the coils 52*a* to 52*d* are arranged at positions away from the center of the plasma processing space 10*s* from in the direction of the central axis X.

For example, as shown in FIG. 9, from the direction of the central axis X, a distance L2 between the end portion 521*a* of the coil 52*a* and the inner coil 51 is longer than a distance L1 between the end portion 520*a* of the coil 52*a* and the inner coil 51. This is also applied to the coils 52*b* to 52*d*. The inner coil 51 is disposed substantially at the center of the plasma processing space 10*s* in the direction of the central axis X. As described above, in the present embodiment, the open ends (the end portions 521*a* to 521*d*) of the coils 52*a* to 52*d* are arranged at positions farther from the inner coil 51 compared to the end portions 520*a* to 520*d* of the coils 52*a* to 52*d*. Accordingly, the effect of capacitive coupling between the plasma produced in the plasma processing space 10*s* and each of the end portions of the coils 52*a* to 52*d* can be suppressed.

Further, in the third embodiment, the voltages at the open ends of the coils 52*a* to 52*d* are high, so that the strength of the electric field radiated from the open ends increases. Therefore, charged particles such as ions are attracted near the open ends by the electric field emitted from the coils 52*a* to 52*d*, and the attracted charged particles may sputter the window member 101 near the open ends. Accordingly, particles may be generated at the window member 101 near the open ends.

Figure 10:
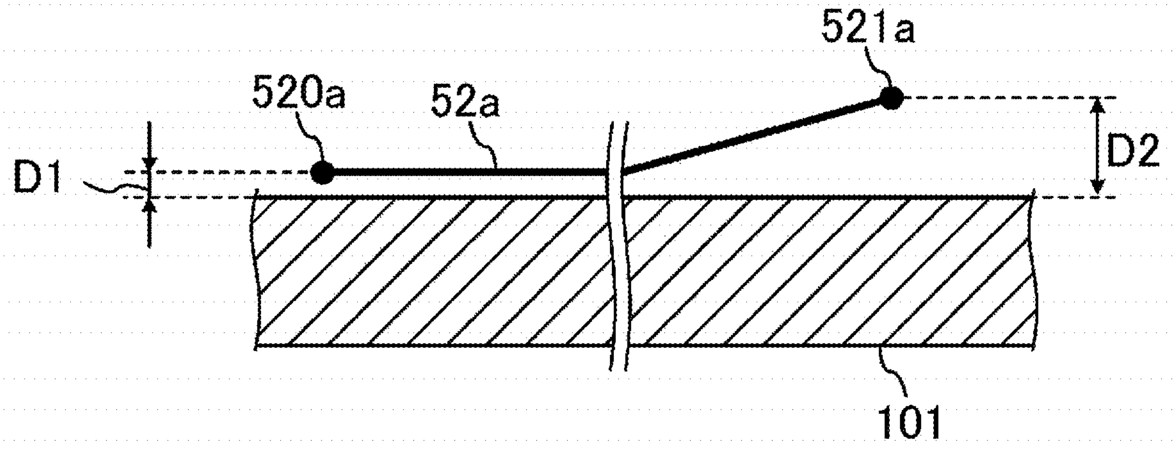
FIG. 10 shows an example of a distance between an end of a second coil and a window member.

Therefore, in the third embodiment, as shown in FIG. 10, for example, a distance D2 between the end portion 521*a* of the coil 52*a*, which is an open end, and the window member 101 is longer than a distance D1 between the end portion 520*a* of the coil 52*a* and the window member 101. This is also applied to the coils 52*b* to 52*d*. In other words, it is preferable that the open ends (the end portions 521*a* to 521*d*) of the coils 52*a* to 52*d* are arranged at positions farther from the window member 101 compared to the end portions 520*a* to 520*d* of the coils 52*a* to 52*d* that are connected to the variable capacitors. Accordingly, the generation of particles at the window member 101 can be suppressed.

[Other Applications]

The present disclosure is not limited to the above-described embodiments, and can be variously modified within the scope of the gist of the present disclosure.

For example, in each of the above-described embodiments, a device for measuring the state of plasma produced in the plasma processing space 10*s* may be provided, and the capacitances of the variable capacitors 53*a* to 53*d* may be adjusted based on the measured plasma state. For example, when the measured plasma distribution is not uniform, the capacitances of the variable capacitors 53*a* to 53*d* may be adjusted such that the currents that suppress the non-uniformity flow through the coils 52*a* to 52*d*. Such control is implemented by the controller 2, for example.

When the non-uniformity of processing on the substrate W is detected in a previous step, the plasma may be intentionally distributed to eliminate such non-uniformity in the plasma processing apparatus 1. Accordingly, in a semiconductor device manufactured by multiple steps, it is possible to suppress the non-uniformity of the processing as a whole and improve the quality of the semiconductor device.

It should be noted that the embodiments of the present disclosure are illustrative in all respects and are not restrictive. The above-described embodiments can be embodied in various forms. Further, the above-described embodiments may be omitted, replaced, or changed in various forms without departing from the scope of the appended claims and the gist thereof.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

The invention claimed is:

1. A plasma processing apparatus comprising:

a chamber accommodating a substrate;

a window member forming an upper portion of the chamber;

a gas inlet port disposed in at least one of a sidewall of the chamber and the window member, and configured to supply a gas into the chamber; and an antenna disposed above the chamber with the window member interposed therebetween, having a linear shape and made of a conductive material, and configured to produce plasma from the gas supplied into the chamber by radiating a radio frequency (RF) power into the chamber, wherein the antenna includes:

a first coil to which the RF power is supplied, the first coil having a spiral shape centering on a central axis of the first coil; and a plurality of second coils inductively coupled with the first coil and arranged around the first coil to be rotationally symmetrical with respect to the central axis of the first coil, wherein each of the plurality of second coils has a shape of a part of an arc, respectively, and the plurality of second coils are arranged in a direction so that the arc is not concentric with the spiral shape of the first coil, wherein one ends of the second coils are connected one-to-one to variable capacitors, each of currents flowing through each of the plurality of second coils being independently adjusted by adjusting capacitances of the variable capacitors.

2. The plasma processing apparatus of claim 1, wherein a first end of each of the plurality of second coils is grounded, a second end of each of the plurality of second coils is connected to one end of each of the variable capacitors, respectively, and other end of each of the variable capacitors is grounded.

3. The plasma processing apparatus of claim 1, wherein a first end of each of the plurality of second coils is grounded through capacitors, a second end of each of the plurality of second coils is connected to one end of each of the variable capacitors, respectively, and the other end of each of the variable capacitors is grounded.

4. The plasma processing apparatus of claim 1, wherein a first end of each of the plurality of second coils is connected to a second end of each of the plurality of second coils, through each of the variable capacitors corresponding to each of the second coils, respectively.

5. The plasma processing apparatus of claim 4, wherein the plurality of second coils are curved and arranged around the first coil to be convex in a direction moving away from the first coil.

6. The plasma processing apparatus of claim 4, wherein the first end of each of the plurality of second coils is disposed at a position farther from the first coil compared to the second end of each of the plurality of second coils, respectively.

7. The plasma processing apparatus of claim 6, wherein, from the direction of the central axis, a first distance between the first end of each of the plurality of second coils and the first coil is longer than a second distance between the second end of each of the plurality of second coils and the first coil, respectively.

8. The plasma processing apparatus of claim 1, wherein a first end of each of the plurality of second coils is opened, and a second end of each of the plurality of second coils is grounded through each of the variable capacitors corresponding to each of the second coils, respectively.

9. The plasma processing apparatus of claim 8, wherein the first end of each of the plurality of second coils is disposed at a position farther from the first coil compared to the second end of each of the plurality of second coils, respectively.

10. The plasma processing apparatus of claim 9, wherein the first end of each of the plurality of second coils is disposed at positions farther from the window member compared to the second end of each of the plurality of second coils, respectively.

11. The plasma processing apparatus of claim 10, wherein in a vertical direction, a third distance between the first end of each of the plurality of second coils and a top surface of the window member is longer than a fourth distance between the second end of each of the plurality of second coils and the top surface of the window member, respectively.

12. The plasma processing apparatus of claim 9, wherein the plurality of second coils are curved and arranged around the first coil to be convex in a direction moving away from the first coil.

13. The plasma processing apparatus of claim 9, wherein, from a direction of the central axis of the first coil, a first distance between the first end of each of the plurality of second coils and the first coil is longer than a second distance between the second end of each of the plurality of second coils and the first coil, respectively.

14. The plasma processing apparatus of claim 8, wherein the first end of each of the plurality of second coils is disposed at a position farther from the window member compared to the second end of each of the plurality of second coils, respectively.

15. The plasma processing apparatus of claim 8, wherein the plurality of second coils are curved and arranged around the first coil to be convex in a direction moving away from the first coil.

16. The plasma processing apparatus of claim 1, wherein the first coil has a rotationally symmetrical shape with respect to the central axis.

17. The plasma processing apparatus of claim 1, wherein the first coil has a plurality of coils spaced apart from each other.

18. The plasma processing apparatus of claim 1, wherein the plurality of second coils are curved and arranged around the first coil to be convex in a direction moving away from the first coil.

19. The plasma processing apparatus of claim 1, wherein the first coil and the second coils are arranged on the same plane.

20. The plasma processing apparatus of claim 1, further comprising:

circuitry configured to adjust the capacitances of the variable capacitors to control each of the currents flowing through each of the plurality of second coils, independently, so that density of the plasma produced in a plasma processing space below the plurality of second coils is adjusted.

* * * * *